United States Patent
Isobe

(10) Patent No.: US 7,190,234 B2
(45) Date of Patent: Mar. 13, 2007

(54) CURRENT SUPPLY CIRCUIT, RING OSCILLATOR, NONVOLATILE SEMICONDUCTOR DEVICE AND ELECTRONIC CARD AND ELECTRONIC DEVICE

(75) Inventor: Katsuaki Isobe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/930,801

(22) Filed: Sep. 1, 2004

(65) Prior Publication Data

US 2005/0088245 A1    Apr. 28, 2005

(30) Foreign Application Priority Data

Sep. 2, 2003    (JP) .............................. 2003-310271

(51) Int. Cl.
*H03L 7/099* (2006.01)
(52) U.S. Cl. ......................................... 331/57; 331/185
(58) Field of Classification Search .................. 331/57, 331/185
See application file for complete search history.

(56) References Cited

U.S. PATENT DOCUMENTS

| 6,414,516 B1 * | 7/2002 | Labram et al. ............... 326/83 |
| 6,549,154 B2 | 4/2003 | Isobe et al. |
| 2003/0076179 A1 * | 4/2003 | Branch et al. ................ 331/57 |

* cited by examiner

*Primary Examiner*—Joseph Chang
(74) *Attorney, Agent, or Firm*—Oblon, Spivak, McClelland, Maier & Neustadt, P.C.

(57) ABSTRACT

A current supply circuit is disclosed, which comprises a first circuit configured to generate a first current having a positive dependence with respect to a power supply voltage and not depending upon a variation in temperature and in threshold value of a transistor used, a second circuit configured to generate a second current having a positive dependence greater than that of the first current with respect to the power supply voltage and not depending upon a variation in temperature and in threshold value of a transistor used, and a third circuit configured to subtract the second current form the first current to generate a third current having a negative dependence with respect to the power supply voltage.

23 Claims, 7 Drawing Sheets

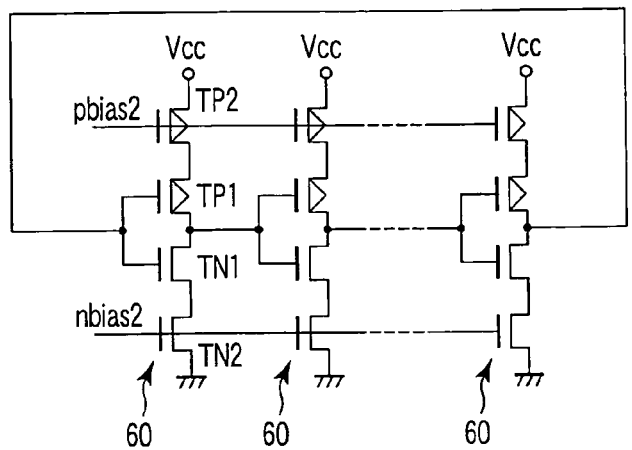
F I G. 6
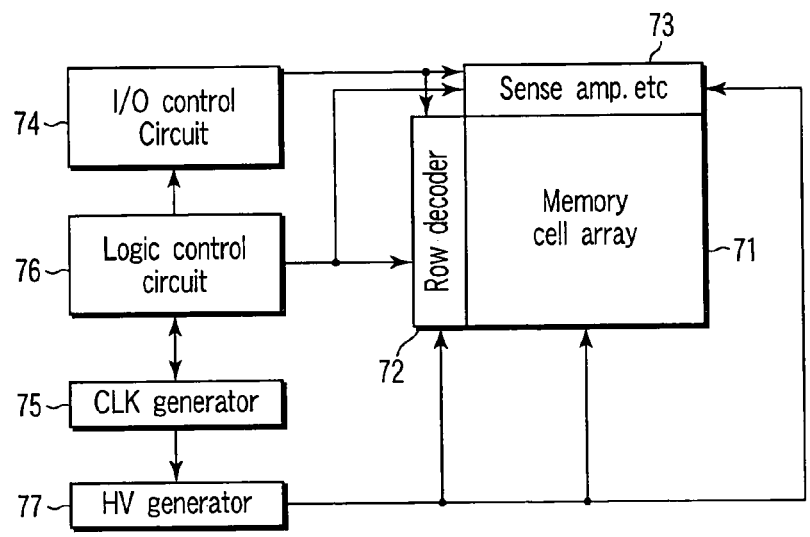
F I G. 7
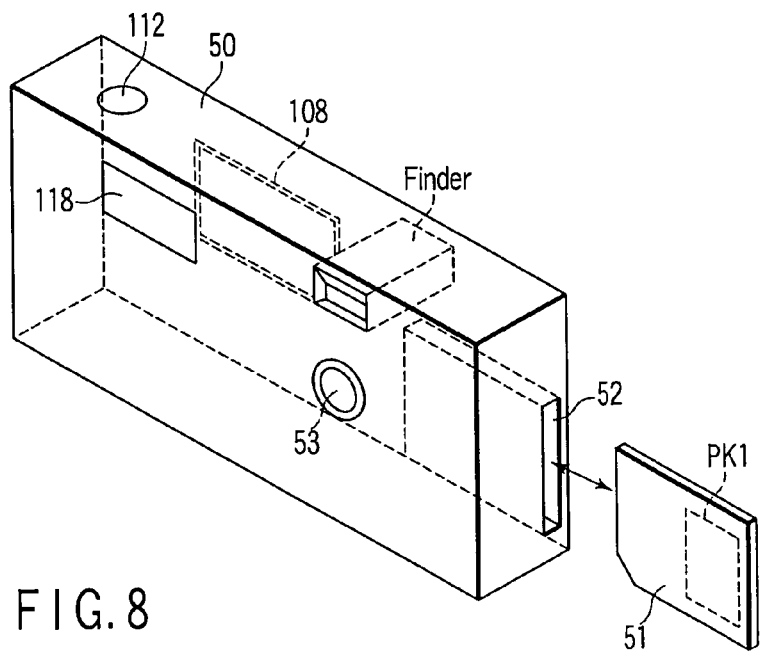
F I G. 8

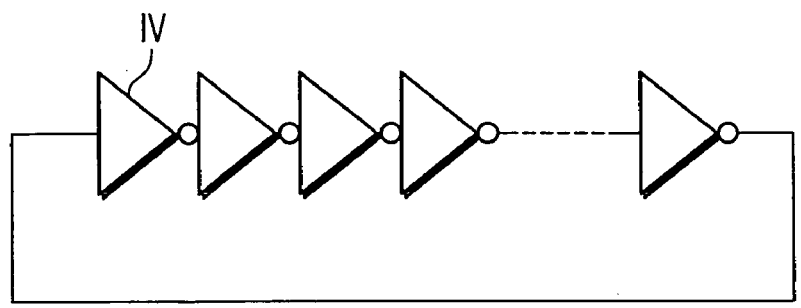
F I G. 20
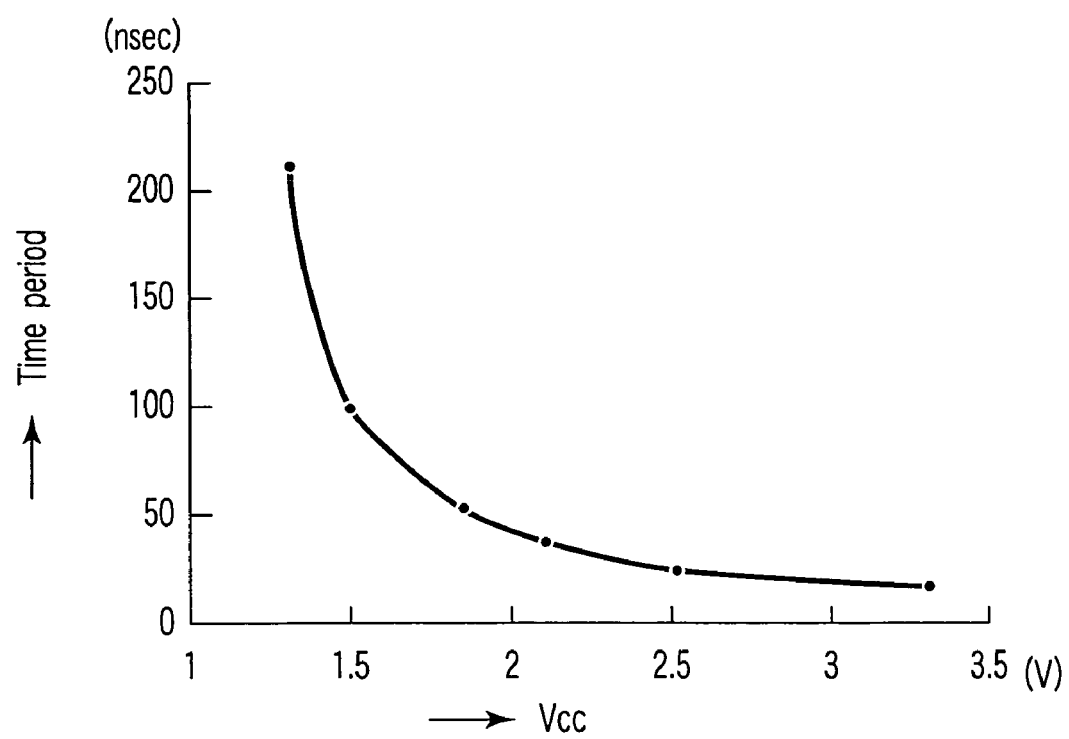
F I G. 21

CURRENT SUPPLY CIRCUIT, RING OSCILLATOR, NONVOLATILE SEMICONDUCTOR DEVICE AND ELECTRONIC CARD AND ELECTRONIC DEVICE

CROSS-REFERENCE TO RELATED APPLICATIONS

This application is based upon and claims the benefit of priority from prior Japanese Patent Application No. 2003-310271, filed Sep. 2, 2003, the entire contents of which are incorporated herein by reference.

BACKGROUND OF THE INVENTION

1. Field of the Invention

The present invention relates to a current supply circuit, a current-controlled type ring oscillator, a nonvolatile semiconductor memory device using these elements and an electronic card and electronic device using these and is used for, for example, a NAND flash memory and its applied devices.

2. Description of the Related Art

A semiconductor device sometimes has a built-in ring oscillator for generating a clock for use in an internal timer circuit, booster circuit and so on.

FIG. 20 shows one example of a conventional ring oscillator incorporated in the semiconductor device.

The ring oscillator is comprised of an odd number stage of inverters IV arranged as a ring-like array in which the inverter IV is used as a unit delay element. The oscillation period Tosc of the ring oscillator is determined by the stage number n of the inverters and a rising time tph and falling time tpl of an output signal of each inverter and can be represented by $$Tosc = n \times (tph + tpl)$$

It is desirable that the clock signal of the timer circuit, booster circuit, etc., be set to have an accurate period not depending upon the power supply voltage, threshold value of a transistor and so on or the period can be controlled. Further, it is desirable that, in order to heighten the voltage boosting efficiency of the booster circuit, the clock signal of the booster circuit be set to have a period which becomes shorter as the power supply voltage is lowered and longer as the power supply voltage is raised.

Since, however, in the ring oscillator with the inverter IV used as a unit delay element, the rising time tph and falling time tpl of the output signal of the inverter IV become shorter as the power supply voltage is raised, the period of the generating clock signal becomes shorter as the power supply voltage is raised.

FIG. 21 shows a characteristic curve revealing one example of a power supply voltage dependence of the oscillation period Tosc of the ring oscillator shown in FIG. 20.

Although, in a region of the power supply voltage which is higher than 2V, less power supply voltage dependence of the oscillation period Tosc is involved, when the power supply voltage falls from 2V, the oscillation period Tosc becomes abruptly longer, that is, the oscillation frequency is abruptly lowered.

In the case where the output of the ring oscillator shown in FIG. 20 is used as a clock signal of the booster circuit, if the booster circuit is optimized to a lower voltage operation, the voltage boosting capability of the booster circuit becomes too high at a high voltage operation time and, for example, a ripple problem is involved.

Since the rising time tph and falling time tpi of the output signal of the inverter in the ring oscillator shown in FIG. 20 depend upon the threshold value of the transistor, it is difficult to control the oscillation period Tosc (the period of the generating clock signal) when taking a variation of the threshold value into consideration.

FIG. 22 shows another conventional example of a ring oscillator incorporated into the semiconductor device.

This ring oscillator is comprised of an odd number stage of differential amplifiers 90 arranged in a ring-like array in which the differential amplifier 90 operated at a constant current is used as a unit delay element.

Each differential amplifier 90 comprises a pair of transistors N1, N2 supplied with a complementary signal from a preceding stage differential amplifier 90, load resistors Rr each connected between a power supply node and the drain of the corresponding transistor (N1, N2), a current supply NMOS transistor N3 connected between a grounded node and a source common-connected node of the transistors N1, N2 and having its gate supplied with a bias voltage biasn to allow a flow of a constant current Ir, and an output capacitance Cr including a parasitic capacitance.

The delay time of the differential amplifier 90 is determined by a constant current Ir, load resistance Rr and output capacitance Cr including a parasitic capacitance. As the current Ir becomes larger, resistance Rr becomes smaller and capacitance Cr becomes smaller, the delay time becomes shorter. By varying these parameters it is possible to vary the period of a clock signal generated from the ring oscillator. Further, the amplitude of a complementary clock signal which is outputted from the differential amplifier 90 is determined by Rr×Ir and does not depend upon the power supply voltage Vcc, so that it is strong against a power supply variation and lower voltage.

It is known that, in order to generate a constant current not depending upon the temperature, the current of a power supply having a positive temperature characteristic and current of a power supply having a negative temperature characteristic are additively combined with the use of a band gap reference (BGR) type reference voltage supply whereby the temperature characteristics cancel each other.

FIGS. 23, 24 and 25 show, by way of example, a BGR type current supply having a positive temperature characteristic, a current supply having a negative temperature characteristic and a temperature characteristic canceling power supply, respectively.

In FIG. 23, a current Ia having a positive temperature characteristic can be represented by $$Ia = 2kT \cdot \ln N / Ra2 \cdot q$$

and has a positive temperature characteristic, noting that N represents an area ratio of two diodes.

In FIG. 24, a current Ib having a negative temperature characteristic can be represented by $$Ib = VA/Rb$$

noting that VA is determined by the characteristic of the diode and, since VA becomes lower as the temperature is raised, has a negative temperature characteristic.

If the ratio between Ia and Ib is optimally selected, it is possible to cancel these temperature characteristics by additively combining the copying current Ia corresponding to the current Ia of the current supply shown in FIG. 23 and copying current Ib corresponding to the current Ib of the current supply shown in FIG. 24. By copying the thus obtained current Ic by the current mirror circuit it is possible to generate two bias voltages nbias and pbias by two diode-connected transistors and, based on this, provide a constant current supply. The thus generated current Ic reveals no Vcc dependence and, since the bias voltages nbias and pbias vary by the threshold value of the transistor used, reveals no threshold value dependence.

If, however, the current supply operation shown in FIG. 25 is made to correspond to a current supply voltage Vcc of a broader range from, for example, about 4V to about 1V, a drain/source voltage Vds of a constant current supply transistor also varies under the power supply voltage Vcc in accordance therewith. In this case, it is better to set the IV characteristic of a pentode area of a transistor to be constant irrespective of Vds but, even in the pentode area, Ids is normally increased with an increasing Vds. That is, strictly, the constant current supply also comes to have a positive dependence with respect to the power supply voltage Vcc.

In the case where the ring oscillator as set out above is constructed with the use of such a current supply, the constant current supply has a positive power supply voltage dependence and the period of the output clock signal becomes shorter when the power supply voltage becomes higher and longer when the power supply voltage becomes lower, thus presenting a problem.

Incidentally, U.S. Pat. No. 6,414,516 specification discloses the technique of controlling the operation of a portion of a circuit constituting a ring oscillator using a difference current between a current of a constant current supply and a current depending upon a power supply voltage.

BRIEF SUMMARY OF THE INVENTION

According to an aspect of the present invention there is provided a current supply circuit comprising:

a first circuit configured to generate a first current having a positive dependence with respect to a power supply voltage and not depending upon a variation in temperature and in threshold value of a transistor used;

a second circuit configured to generate a second current having a positive dependence greater than that of the first current with respect to the power supply voltage and not depending upon a variation in temperature and in threshold value of a transistor used; and a third circuit configured to subtract the second current form the first current to generate a third current having a negative dependence with respect to the power supply voltage.

According to another aspect of the present invention there is provided a current supply voltage circuit comprising:

a first current mirror circuit comprising a diode-connected first NMOS transistor, a first resistive element connected between the first NMOS transistor and a power supply node supplied with a power supply voltage, a second NMOS transistor configured to allow a flow of a mirror current corresponding to a first current flowing through the first NMOS transistor, and a first PMOS transistor configured to allow a flow of the mirror current which flows through the second NMOS transistor;

a feedback circuit comprising a second PMOS transistor supplied as a gate potential with an output of an operational amplifier which is supplied as a comparison potential with a potential on a drain/gate connection node of the first NMOS transistor, a second resistive element connected to the drain of the second PMOS transistor and having a-resistive value equal to that of the first resistive element and a feedback loop configured to supply a drain potential of the second PMOS transistor to a reference input of the operational amplifier and to allow a second current to flow through the second PMOS transistor;

a current addition circuit configured to additively combine a copying current corresponding to the first current and copying current corresponding to the second current; and a second current mirror circuit comprising a third NMOS transistor configured to allow a flow of a third current obtained by the current addition circuit, a fourth NMOS transistor configured to allow a flow of a mirror current corresponding to a third current flowing through the third NMOS transistor, and a third PMOS transistor configured to allow a flow of the mirror current which flows through the fourth NMOS transistor, wherein a bias voltage having a positive dependence with respect to a power supply voltage is taken out from the gate of the third NMOS transistor or third PMOS transistor.

According to a further aspect of the present invention there is provided a ring oscillator comprising:

a current supply having a negative dependence with respect to a power supply voltage; and an odd number stage of current controlled type unit delay elements connected in a ring-like array and configured to have their delay time controlled by the current supply.

According to a further aspect of the present invention there is provided a nonvolatile semiconductor memory device comprising:

a booster circuit configured to receive a clock signal generated by a ring oscillator set out in the aspect of the present invention to allow a voltage raising operation; and a nonvolatile memory cell array for allowing a data read/write/erase operation with the use of an output voltage of the booster circuit.

According to a further aspect of the present invention there is provided an electronic card having the nonvolatile semiconductor memory device mounted thereon, set out in the aspect of the present invention.

According to a further aspect of the present invention there is provided an electronic device comprising:

the electronic card set out in the aspect of the present invention;

a card slot electrically connectable to the electronic card; and a card interface connected to the card slot.

BRIEF DESCRIPTION OF THE SEVERAL VIEWS OF THE DRAWING

FIG. 6 is a circuit arrangement of a current-controlled type ring oscillator according to a fourth embodiment of the present invention;

FIG. 7 is a block diagram of a whole structure of a NAND flash memory according to a fifth embodiment of the present invention, that is, a whole structure of a NAND flash memory having a built-in ring counter as shown in FIG. 4, 5 or 6 and a built-in booster circuit configured to generate a high voltage upon receipt of its output clock;

FIG. 8 is a partly-transparent, perspective view showing a digital still camera as one example of an electronic device using an electronic card having a NAND flash memory shown in FIG. 7 according to a sixth embodiment of the present invention;

FIG. 20 is a circuit arrangement showing one example of a conventional ring oscillator with a semiconductor device incorporated therein;

FIG. 21 is a characteristic curve showing one example of a power supply voltage dependence with respect to an oscillation period of a ring oscillator shown in FIG. 20;

DETAILED DESCRIPTION OF THE INVENTION

The embodiments of the present invention will be described in more detail below with reference to the accompanying drawings.

(First Embodiment)

Figure 1:
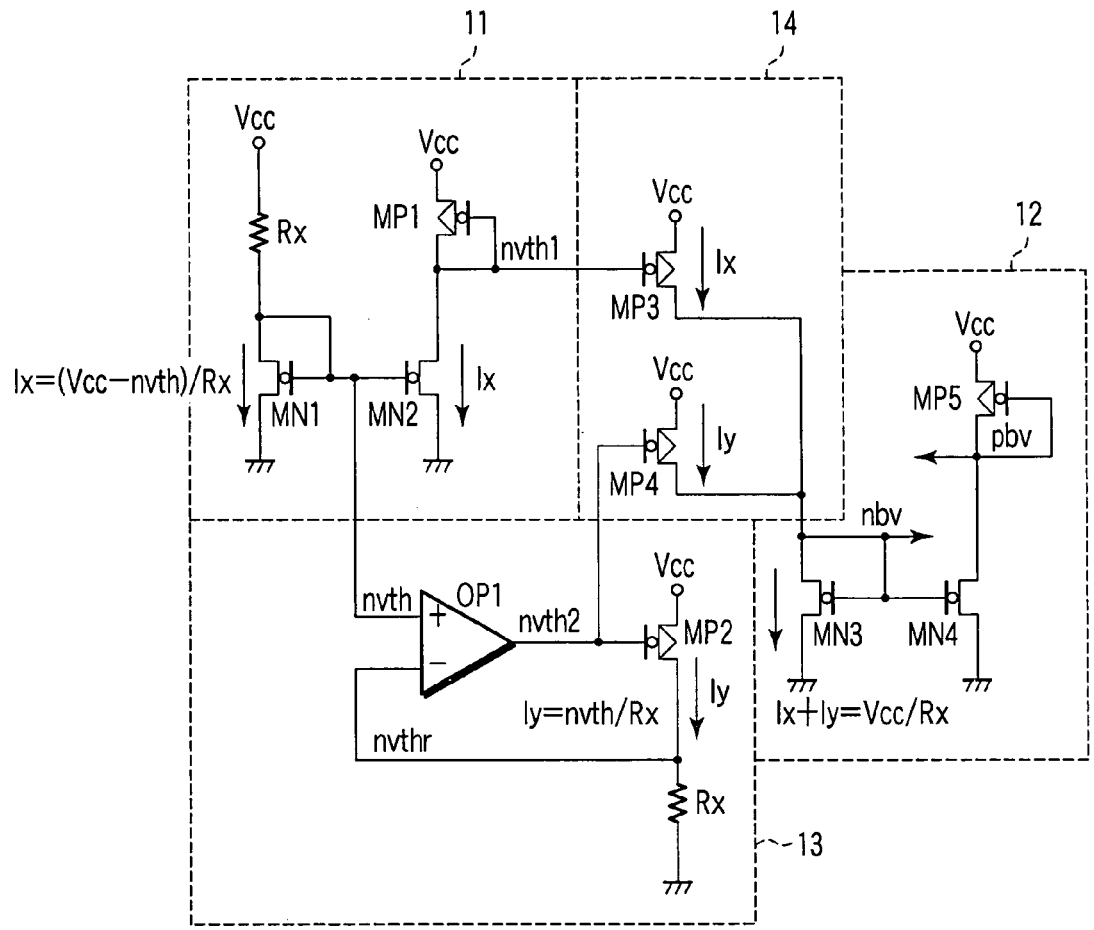
FIG. 1 is a circuit arrangement of a current supply circuit according to a first embodiment of the present invention.

FIG. 1 shows a current supply circuit according to a first embodiment of the present invention.

The current supply circuit comprises a first current mirror circuit 11, a second current mirror circuit 12, a feedback circuit 13 and a current addition circuit 14.

The first current mirror circuit 11 comprises a first NMOS transistor MN1 comprised of a diode-connected transistor, a first resistive element Rx connected between a Vcc node supplied with a power supply voltage Vcc and a drain of the first NMOS transistor MN1, a second NMOS transistor MN2 supplied with a mirror current corresponding to a first current IX=(Vcc−nvth)/Rx flowing through the NMOS transistor MN1 and a first PMOS transistor MP1 comprised of a diode-connected (gate/drain connected) transistor supplied with a current of the second NMOS transistor MN2. Here, a potential nvth1 generated on the gate node of the first PMOS transistor MP1 is referred to as a mirror potential.

The feedback transistor 13 comprises a second PMOS transistor MP2 having its source connected to a Vcc node, a second resistive element Rx connected to the drain of the second PMOS transistor MP2, and an operational amplifier OP1 for receiving a potential (nvth) on a drain/gate connection node of the first NMOS transistor MN1 as a comparison input and a drain potential (nvthr) of the second PMOS transistor MP2 as a feedback input and for generating an output potential nvth2 as a gate potential of the second PMOS transistor MP2. By the operation of the operational amplifier OP1 these inputs are made equal to each other and a second current Iy=nvth/Rx flows through the second PMOS transistor MP2.

The current addition circuit 14 comprises a third PMOS transistor MP3 comprised of a diode-connected transistor for receiving a mirror potential nvth1 as a gate potential which is generated on the first current mirror circuit 11 and a fourth PMOS transistor MP4 comprised of a diode-connected transistor for receiving an output potential nvth2 of the operational amplifier OP1 as a gate potential. The current addition circuit is configured to additively combine a copying current corresponding to a first current Ix flowing through the third PMOS transistor MP3 and a copying current corresponding to a second current Iy flowing through the fourth PMOS transistor MP4. By doing so, a combined current (Ix+Iy)Vcc/R is obtained.

The second current mirror circuit 12 comprises a third NMOS transistor MN3 comprised of a diode-connected transistor for allowing the combined current Vcc/R to flow therethrough, a fourth NMOS transistor MN4 for allowing a flow of a mirror current corresponding to a current Vcc/R flowing through the third NMOS transistor MN3, and a fifth PMOS transistor MP5 comprised for a diode-connected transistor configured to receive a current of the fourth NMOS transistor MN4. Here, a potential (bias voltage nvb) generated on a gate node of the third NMOS transistor MN3 and a potential (bias voltage pbv) generated on a gate node of the fifth PMOS transistor MP5 are taken out and used in other circuits.

The respective MOS transistors in FIG. 1 is of such an enhancement type having a lower threshold voltage characteristic and operable even if Vcc is as low as, for example, about 1.6V to 1.8V.

According to the power supply circuit of FIG. 1, it is possible to generate a current Vcc/R having a positive dependence with respect to the power supply voltage Vcc.

(Second Embodiment)

Figure 2:
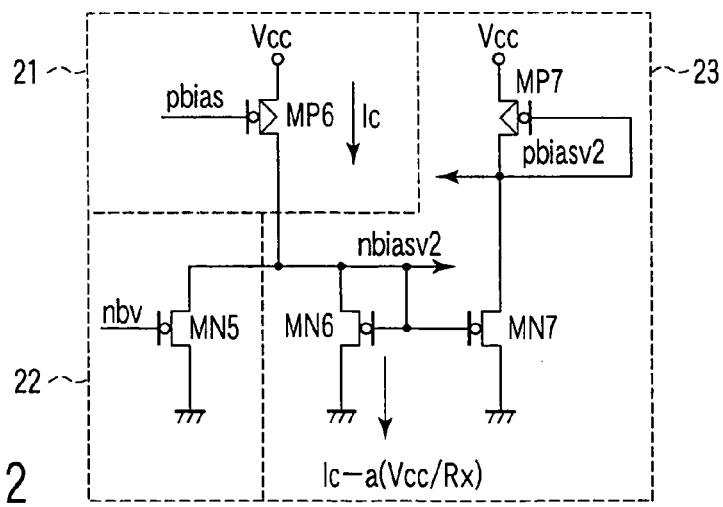
FIG. 2 is a circuit arrangement of a current supply circuit according to a second embodiment of the present invention.

FIG. 2 shows a current supply circuit according to a second embodiment of the present invention.

The current supply circuit includes a first circuit 21 for generating a first current Ic having a positive dependence (characteristic increasing with an increasing Vcc) with respect to a power supply voltage Vcc without depending upon a variation in temperature and in threshold value of a transistor used, a second circuit 22 for generating a second current having a positive dependence greater than that of the first current with respect to the power supply voltage Vcc without depending upon a variation in temperature and in threshold value of a transistor used, and a third circuit 23 connected to the first circuit 11 and second circuit 12 and configured to subtract the second current from the first current to generate a third current having a negative dependence with respect to the power supply voltage Vcc, a mirror current corresponding to the third current flowing through the third current.

Figure 25:
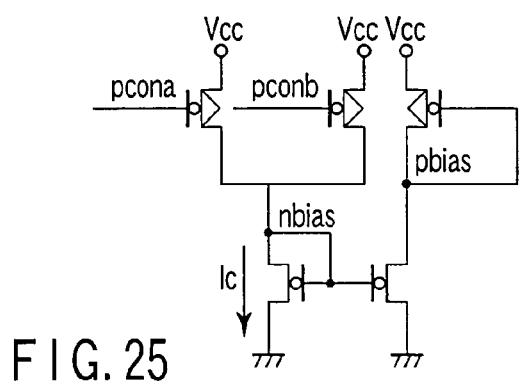
FIG. 25 is a circuit arrangement showing one example of a current supply configured to cancel temperature characteristics.

The first circuit 21 is comprised of a diode-connected PMOS transistor MP6 having its gate supplied with a bias voltage pbias generated on a first current supply of the conventional example as set forth with reference to FIG. 25. The first current Ic flowing though the PMOS transistor MP6 has a positive Vcc dependence.

The second circuit 22 is comprised of a diode-connected NMOS transistor MN5 having its gate supplied with a bias voltage nbv which is generated in the current supply circuit as described referring to FIG. 1 and has a positive dependence with respect to the power supply voltage Vcc.

A second current flowing through NMOS transistor MN5 is a current a×(Vcc/Rx) which is proportional to a current Vcc/Rx generated in the current supply circuit of FIG. 1. This proportional coefficient a is determined by a ratio (mirror ratio) of a channel width of the NMOS transistor MN5 to the channel width of the NMOS transistor MN3 which generates a bias voltage nbv in the current supply circuit of FIG. 1.

The third circuit 23 comprises a current mirror circuit connected to a node of a series connection of the PMOS transistor MP6 and NMOS transistor MN5. The current mirror circuit comprises a diode-connected NMOS transistor MN6 for allowing a flow of a difference current between a current of the PMOS transistor MP6 and a current of an NMOS transistor MN5 and an NMOS transistor MN7 for allowing a flow of a mirror current corresponding to a current of an NMOS transistor MN6. The current of the NMOS transistor MN7 flows through a diode-connected PMOS transistor MP7.

A current Ic−a×(Vcc/Rx), that is, a difference current obtained by subtracting a current a×(Vcc/Rx), flowing through the NMOS transistor MN5 of the second circuit 22 from a current Ic flowing through the PMOS transistor MP6 of the first circuit 21, is inputted to the NMOS transistor MN6 of the current mirror circuit. A potential on the gate node of the NMOS transistor MN5 is utilized as a gate bias voltage nbiasv2 and a potential on the gate node of the PMOS transistor MP7 is utilized as a gate bias voltage pbiasv2.

Here, if the proportional coefficient a is so selected as to make the Vcc dependence of the current a×(Vcc/Rx) greater than the Vcc dependence of the current Ic, it is possible to generate bias voltages nbiasv2 and pbiasv2 having a negative Vcc dependence. The current generated with the use of the gate bias voltages nbiasv2 and pbiasv2 does not depend upon a variation in threshold value of the transistor used and temperature characteristic.

If the proportional coefficient a is so selected as to make the Vcc dependence of the current a×(Vcc/Rx) equal to the Vcc dependence of the current Ic, it is possible to cancel the Vcc dependences of the gate bias voltages nbiasv2 and pbiasv2.

(Variant of Second Embodiment)

Figure 3:
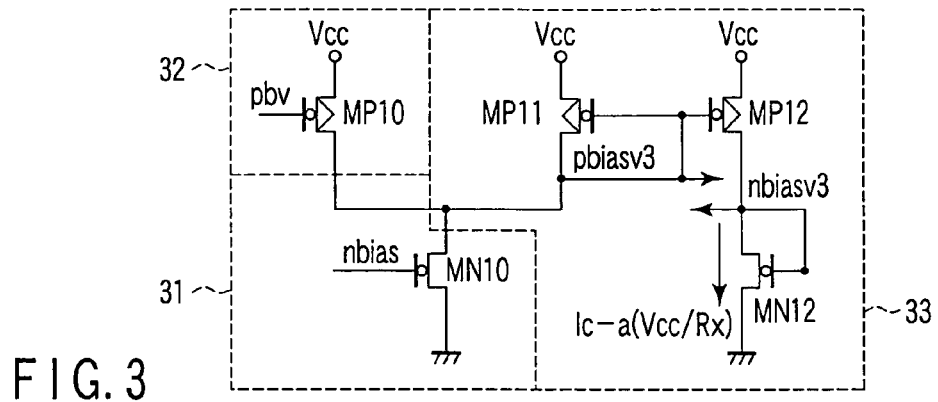
FIG. 3 is a circuit showing a variant of the current supply circuit according to the second embodiment of the present invention shown in FIG. 2.

FIG. 3 shows a current supply circuit according to a variant of the second embodiment (FIG. 2). The current supply circuit according to this variant is such that, when compared with the above-mentioned current supply circuit while referring to the variant (FIG. 2) of the second embodiment, mutual replacement is made between the corresponding NMOS transistors and PMOS transistors and between the corresponding power supply node and a ground node.

The first circuit 31 is comprised of a diode-connected NMOS transistor MN10 having its gate supplied with a bias voltage nbias generated on a first current supply of the conventional example as set forth with reference to FIG. 25. The first current Ic flowing though the NMOS transistor MN10 has a positive Vcc dependence.

The second circuit 32 is comprised of a diode-connected PMOS transistor MP10 having its gate supplied with a bias voltage pbv which is generated in the current supply circuit as described referring to FIG. 1 and has a positive dependence with respect to the power supply voltage Vcc.

A second current flowing through PMOS transistor MP10 is a current a×(Vcc/Rx) which is proportional to a current Vcc/Rx generated in the current supply circuit of FIG. 1. This proportional coefficient a is determined by a ratio (mirror ratio) of a channel width of the PMOS transistor MP10 to the channel width of the PMOS transistor MP5 which generates a bias voltage pbv in the current supply circuit of FIG. 1.

The third circuit 33 comprises a current mirror circuit connected to a node of a series connection of the PMOS transistor MP10 and NMOS transistor MN10. The current mirror circuit comprises a diode-connected PMOS transistor MP11 for allowing a flow of a difference current between a current of the PMOS transistor MP10 and a current of an NMOS transistor MN10 and an PMOS transistor MP12 for allowing a flow of a mirror current corresponding to a current of an PMOS transistor MP11. The current of the PMOS transistor MP11 flows through a diode-connected NMOS transistor MN12.

A current Ic−a×(Vcc/Rx), that is, a difference current obtained by subtracting a current a×(Vcc/Rx), flowing through the PMOS transistor MP10 of the second circuit 32 from a current Ic flowing through the NMOS transistor MN10 of the first circuit 31, is inputted to the PMOS transistor MP11 of the current mirror circuit. A potential on the gate node of the PMOS transistor MP11 is utilized as a gate bias voltage pbiasv3 and a potential on the gate node of the NMOS transistor MN12 is utilized also as a gate bias voltage nbiasv3.

Here, if the proportional coefficient a is so selected as to make the Vcc dependence of the current a×(Vcc/Rx) greater than the Vcc dependence of the current Ic, it is possible to generate bias voltages pbiasv3 and nbiasv3 having a negative Vcc dependence. The current generated with the use of the gate bias voltages pbiasv3 and nbiasv3 does not depend upon a variation in threshold value of the transistor used and temperature characteristic.

If the proportional coefficient a is so selected as to make the Vcc dependence of the current a×(Vcc/Rx) equal to the Vcc dependence of the current Ic, it is possible to cancel the Vcc dependences of the gate bias voltages nbiasv2 and nbiasv3.

The current supply circuits of the second embodiment and its variant include two current supplies having a positive dependence with respect to Vcc without depending upon a variation in temperature and in threshold value of the transistors used (without any temperature dependence and threshold value dependence) and, by subtracting from a current of one current supply a current of another one current supply, it is possible to obtain a current having a negative dependence with respect to Vcc.

(Third Embodiment)

Figure 4:
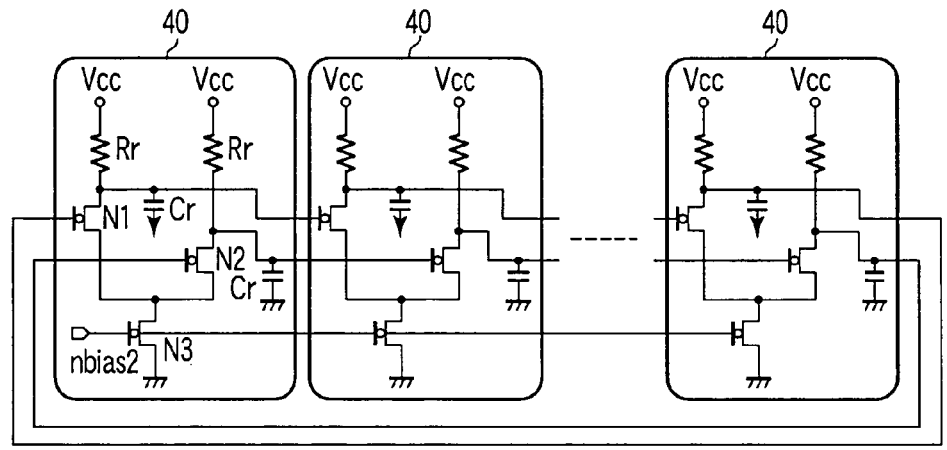
FIG. 4 is a circuit arrangement of a current-controlled type ring oscillator according to a third embodiment of the present invention.

FIG. 4 shows a ring oscillator according to a third embodiment of the present invention.

This ring oscillator is of such a current-controlled type that an odd number stage of differential amplifiers 40 constitutes a ring-like array where, as a unit delay element, use is made of the differential amplifier 40 operated at a constant current.

In the ring oscillator of this embodiment, under a current supply circuit having a negative dependence with respect to Vcc shown in FIGS. 2 and 3, the current of the unit delay elements in the ring oscillator is controlled, so that a clock is generated which quickens the oscillation frequency when Vcc is lowered.

The respective differential amplifier 40 comprises NMOS paired transistors N1, N2 for receiving a complementary signal from a preceding stage differential amplifier 40, load resistors Rr connected between a power supply node and the drains of the NMOS paired transistors N1, N2, a current supply NMOS transistor N3 connected between a source common-connected node of the NMOS paired transistors N1, N2 and a grounded node and having its gate supplied with a bias voltage nbiasv2 (or nbiasv3 from a current supply circuit (FIG. 3) of the variant of the second embodiment) having a negative dependence with respect to Vcc from the current supply circuit (FIG. 2) to allow a constant current Ir to flow therethrough, and an output capacitance Cr including a parasitic capacitance.

The delay time of the differential amplifier 40 is determined by a constant current Ir determined by the bias voltage nbiasv2 (or nbiasv3) having a negative dependence with respect to Vcc, load resistance Rr and output capacitance Cr including a parasitic capacitance. As the current Ir becomes larger, resistance Rr becomes smaller and capacitance Cr becomes smaller, the delay time becomes shorter. By varying these parameters it is possible to vary the period of a clock signal generated from the ring oscillator as shown in FIG. 4. Further, the amplitude of a complementary clock signal which is outputted from the differential amplifier 40 is determined by Rr×Ir and does not depend upon the power supply voltage Vcc, so that it is strong against a power supply variation and lower voltage.

In this case, the drain voltage Vd of the power supply NMOS transistor N3 is increased with Vcc and the current is increased due to an increase in the drain/source voltage Vds. By utilizing such an effect of an increase in a current of the NMOS transistor N3 under Vds having a positive dependence with respect to Vcc against the effect of a decrease in a current of the NMOS transistor N3 under a bias voltage nbiasv2 (or nbiasv3) having a negative dependence with respect to Vcc, it is possible to control the oscillation period of the ring oscillator as set out in paragraphs (1) and (2) below.

(1) A mirror ratio between the nbiasv2 supply transistor MN6 in FIG. 2 (or nbiasv3 supply transistor MN12 in FIG. 3) and the current supply NMOS transistor N3 is set by canceling the effect of an increase in current of the NMOS transistor N3 under Vds having a positive dependence with respect to Vcc by the effect of a decrease in current of the NMOS transistor N3 under nbiasv2 (nbiasv3) having the negative dependence with respect to Vcc. By doing so, the operation current of the unit delay element of the ring oscillator (FIG. 4) ceases to depend upon Vcc and the oscillation period of the ring oscillator ceases to depend upon Vcc.

(2) The above-mirror ratio is set by making the effect of a decrease in current of the NMOS transistor N3 under nbiasv2 (or nbiasv3) having a negative dependence with respect to Vcc greater than the effect of an increase in current of the NMOS transistor N3 under Vds having a positive dependence with respect to Vcc. By doing so, the operation current of the unit delay element of the ring oscillator (FIG. 4) obtains a negative dependence with respect to Vcc and the oscillation period of the ring oscillator becomes shorter as Vcc is lowered.

If the oscillation output of the ring oscillator is amplified to a CMOS level and, for example, used as a clock signal of a booster circuit, the period becomes shorter as Vcc is lowered and becomes longer as Vcc is raised. Therefore, the boosting efficiency of the booster circuit becomes better.

(Variant of Third Embodiment)

Figure 5:
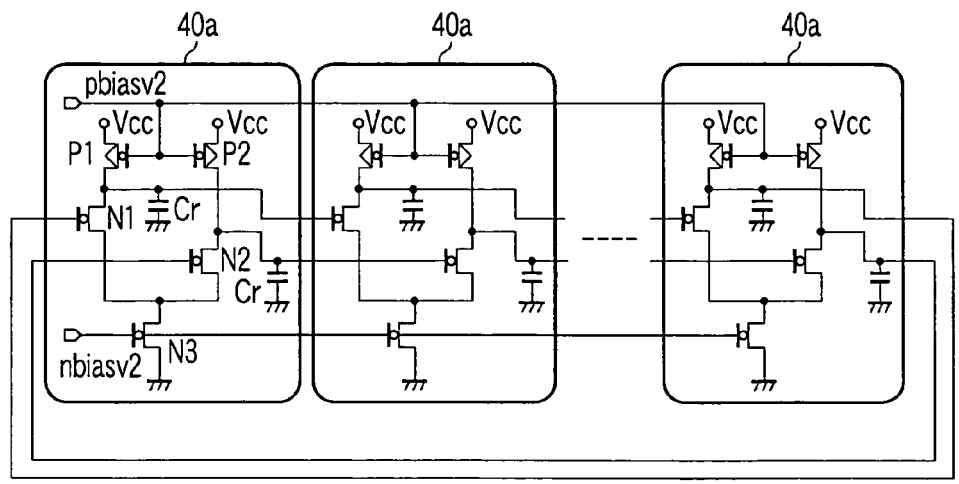
FIG. 5 is a circuit arrangement of a variant of a current controlled type ring oscillator according to the third embodiment of the present invention shown in FIG. 4.

FIG. 5 shows a ring oscillator according to a variant of a third embodiment. The ring oscillator shown in FIG. 5 is different from the ring oscillator as set out in connection with FIG. 4 in that a differential amplifier 40a as the unit delay element has a different structure.

Upon comparison with the differential amplifier 40 used in the ring oscillator as set out in connection with FIG. 4, the differential amplifier 40a used in the ring oscillator shown in FIG. 5 uses PMOS transistors P1, P2 as load resistors and the other portions of the differential amplifier are the same as those shown in FIG. 4. In FIG. 5, the same reference numerals are used to designate parts or elements corresponding to those shown in FIG. 4.

The respective differential amplifier 40a comprises NMOS paired transistors N1, N2 for receiving a complementary signal from a preceding stage differential amplifier 40a, PMOS transistors P1, P2 connected between a power supply node and the drains of the NMOS paired transistors N1, N2 and having their gates supplied with a bias voltage pbiasv2 (or pbiasv3 from the current supply circuit (FIG. 3) of the variant of the second embodiment) having a negative dependence with respect to Vcc from the current supply circuit (FIG. 2), a current supply NMOS transistor N3 connected between a source common-connected node of the NMOS paired transistors N1, N2 and a grounded node and having its gate supplied with the bias voltage nbiasv2 (or nbiasv3 from the current supply circuit (FIG. 3) of the variant of the second embodiment) having the negative dependence with respect to Vcc from the current supply circuit (FIG. 2) to allow a constant current Ir to flow therethrough, and an output capacitance Cr including a parasitic capacitance.

The delay time of the differential amplifier 40a is determined by a constant current Ir determined in accordance with the bias voltage nbiasv2 (or nbiasv3) having a negative dependence with respect to Vcc, resistive values Rr of the load transistors P1, P2 determined in accordance with the bias voltage pbiasv2 (or pbias3) having a negative dependence with respect to Vcc, and a capacitance Cr including a parasitic capacitance. As the current Ir becomes larger, resistance Rr becomes smaller and capacitance Cr becomes smaller, the delay time becomes shorter. By varying these parameters it is possible to vary the period of a clock signal generated from the ring oscillator as shown in FIG. 4. Further, the amplitude of a complementary clock signal which is outputted from the differential amplifier 40 is determined by Rr×Ir and does not depend upon the power supply voltage Vcc, so that it is strong against a power supply variation and lower voltage. As the current Ir becomes larger, resistive value Rr of the load transistors P1, P2 becomes smaller and capacitance Cr becomes smaller, the delay time becomes quicker. By varying these parameters, it is possible to vary the period of a clock signal generated in the ring oscillator shown in FIG. 5. Further, the amplitude of a complementary clock signal which is outputted from the differential amplifier 40a is determined by Rr×Ir and does not depend upon Vcc, so that it is strong against a power supply variation and low voltage.

(Fourth Embodiment)

FIG. 6 shows a current-controlled type ring oscillator according to a fourth embodiment of the present invention. This ring oscillator is of a current controlled type such that an odd number stage of CMOS inverters 60 constitutes a ring-like array in which the CMOS inverter 60 is used as a unit delay element.

The current-controlled type CMOS inverter 60 is such that, between a Vcc node and a grounded node, there are a current-controlled PMOS transistor TP2, a gate-to-gate connected PMOS transistor TP1 and NMOS transistor TN1 and a current-controlled NMOS transistor TN2.

To the gate of the current-controlled PMOS transistor TP2 a bias voltage Pbias2 (or pbias3) having a negative dependence with respect to Vcc as set out above is applied and, to the gate of the current-controlled PMOS transistor TN2, a bias voltage nbiasv2 (or nbiasv3) having a negative dependence with respect to Vcc as set out above is applied.

By controlling a current of the CMOS inverter 60, that is, the unit delay element of the above-mentioned ring oscillator, by means of a current supply circuit having a negative dependence with respect to Vcc, it is possible to, without depending upon the threshold value of the transistor of the CMOS inverter 60, generate a clock signal whose period becomes quicker when Vcc becomes lower.

(Fifth Embodiment)

FIG. 7 shows one example of a whole arrangement of a NAND flash memory having an incorporated ring counter as shown in FIG. 4, 5 or 6 and booster circuit configured to receive that output clock signal and generate a higher voltage.

In FIG. 7, reference numeral 71 shows a memory cell array having NAND type memory cells arranged as a matrix array; 72, a row decoder configured to select the row of the memory cell array 71; 73, a column gate for selecting the column of the memory cell array 71, a sense amplifier for performing a sense amplification of a read-out data, and column control circuit configured to, for example latch write-in data, etc.; 74, an input/outout (I/O) control circuit configured to pass data to and from the column control circuit 73; 75, a clock (CLK) signal generator for generating a clock signal with the use of the above-mentioned ring counter.

A logic control circuit 76 is configured to receive an output clock of the clock signal generator 75 and control the row decoder 72, column control circuit 73, input/output control circuit 74 and clock signal generator 75. The booster circuit (HV generator) 77 is configured to receive the output clock signal of the clock signal generator 75 to boost the power supply voltage, and generate a higher voltage such as write-in voltage, erase voltage, etc., for supply to a well of the memory cell array 71, row decoder 72, column control circuit 73, etc.

(Sixth Embodiment)

FIG. 8 shows one example of an electronic card 51 using the NAND flash memory as set out with reference to FIG. 7 and an arrangement of an electronic device using the electronic card.

Here, as one example of an electronic device, a hand-held electronic device such as a digital still camera 50 is shown. The electronic card (for example, a memory card) 51 is used as a recording medium of the digital still camera 50 and has a sealed IC package PK1 with an integrated NAND flash memory incorporated as set out in connection with the first embodiment.

A casing of the digital still camera 50 has a card slot 52 and a circuit board, not shown, connected thereto. The memory card 51 is detachably mounted in the card slot 52 and, upon being inserted into the card slot 52, electrically connected to an electronic circuit on the circuit board. In this connection it is to be noted that, if the memory card 51 is comprised of a non-contacting type IC card, it is inserted into the card slot 51 or moved nearer to the device to allow an electrical connection to be made by a radio signal to an electronic circuit on the circuit board.

In FIG. 8, reference numeral 53 shows a lens; 108, a display section (for example, a liquid crystal monitor); 112, an operation button such as a shutter button; and 118 a strobe flash unit.

Figure 9:
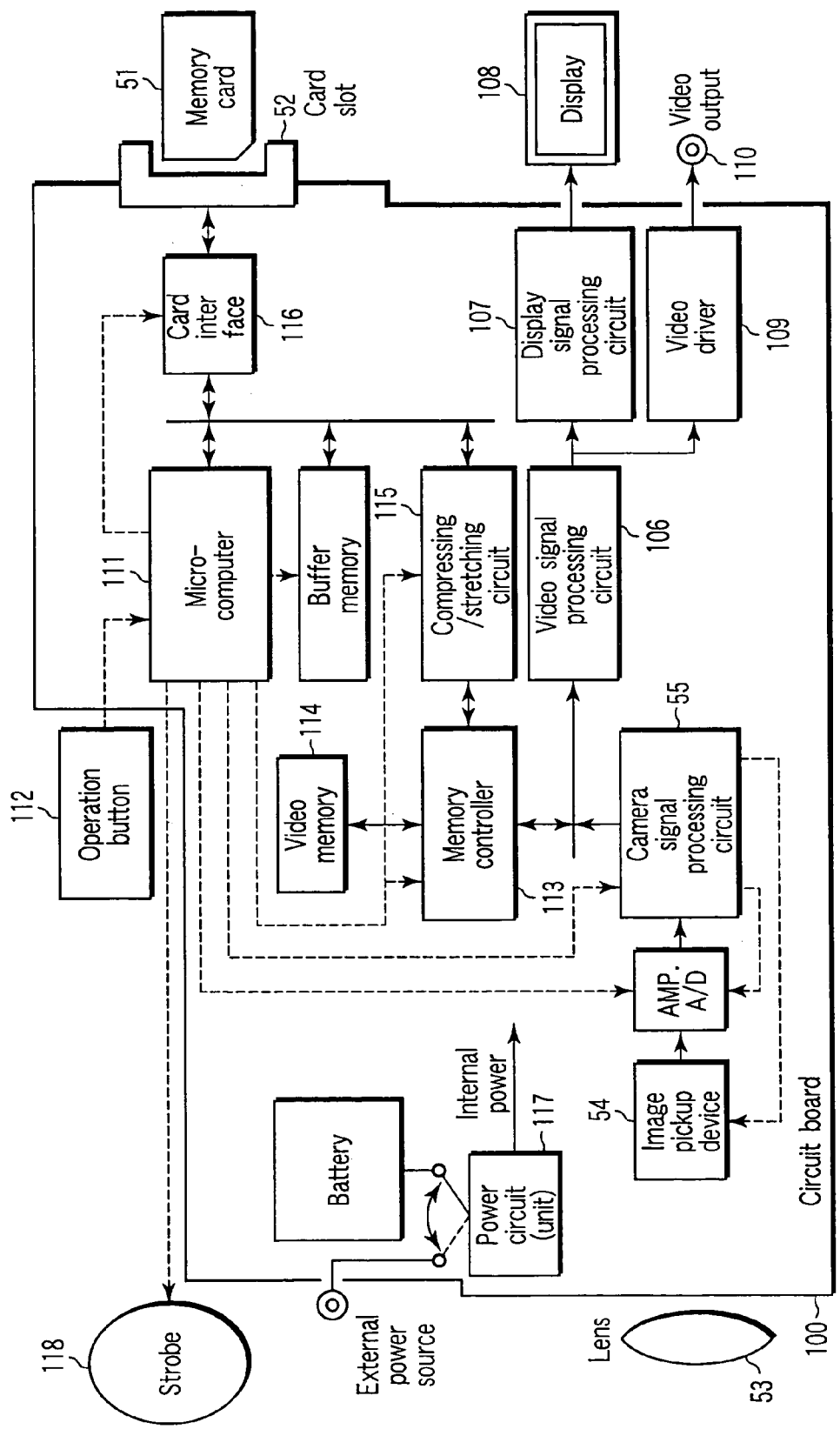
FIG. 9 is a block diagram showing a basic structural form of the digital still camera shown in FIG. 8.

FIG. 9 shows a basic system configuration of a digital still camera shown in FIG. 8.

The light from a subject is condensed by a lense 53 and inputted to an image pickup device 54. The image pickup device, such as a CMOS image sensor, photoelectrically converts the inputted light to, for example, an analog signal. The analog signal, after being amplified by an analog amplifier (AMP.), is converted to a digital signal by means of an analog/digital converter (A/D). The converted signal is inputted to a camera signal processing circuit 55 and, after applying autoexposure (AE) control, automatic white balance control (AWB) and color separation processing for instance, converted to a luminance signal and color difference signal.

In the case where an image is monitored, the luminance signal and color difference signal from the camera signal processing circuit 55 are inputted to a video signal processing circuit 106 to convert these to a video signal. As a video signal system, for example, an NTSC (National Television System Committee) system can be listed. The above-mentioned image pickup device 54, the AMP & A/D circuit and the camera signal processing circuit 55 are controlled by a microcomputer 111.

The video signal which is outputted from the video signal processing circuit is outputted through a display signal processing circuit 107 to a display 108 mounted on a digital still camera 50. Further, the video signal from the video signal processing circuit is supplied via a video driver 109 to a video output terminal 110.

The image taken by the digital still camera 50 can be outputted as a video output to an image device, such as a television, through a video output terminal 110. By doing so, the taken image can be displayed on other than the display section 108.

In the case where the image is captured, the operator depresses an operation button 112. By doing so, the microcomputer 111 controls the memory controller 113 to allow a signal which is outputted from the camera signal processing circuit 55 to be written as a frame image into the video memory 114. The thus written frame image is compressed, by a compression/stretching circuit 115, based on a predetermined compression format and the compressed image is written through a card interface 116 into the memory card 51 inserted into the card slot 52.

In the case where the recorded image is reproduced, the image recorded on the memory card 51 is read out through the card interface 116 and, after being stretched by the compression/stretching processing circuit 115, written into the video memory 114. The written image is inputted to the video signal processing circuit 106 and displayed on the display section 108 and image device as in the case of monitoring the image.

In the above-mentioned structure, the circuit board 100 has the card slot 52, image pickup device 54, AMP. AD, camera signal processing circuit 55, video signal processing circuit 106, display device 107, video driver 109, microcomputer 111, memory controller 113, video memory 114, compression/stretching processing circuit 115 and card interface 116. Here, the card slot 52 need not be provided on the circuit board 100 and electric connection may be made to, for example, a circuit board 100 by a connector cable, etc.

Further, a power circuit (power supply circuit) 117 is provided on the circuit board 100. The power circuit (for example, a DC/DC converter) 117 receives external power or battery power and generates an internal power supply voltage for use in the digital still camera 50. The internal power supply voltage is supplied to not only the above-mentioned respective circuit but also a strobe flash 118 and display section 108.

Figure 10:
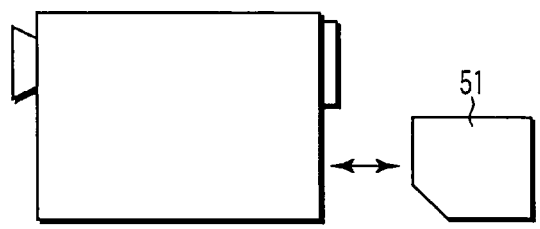
FIG. 10 is a front view diagrammatically showing an electronic device using an electronic card shown in FIG. 9.
Figure 15:
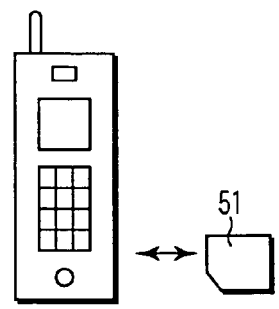
FIG. 15 is a front view diagrammatically showing a further electronic device using the electronic card shown in FIG. 9.
Figure 11:
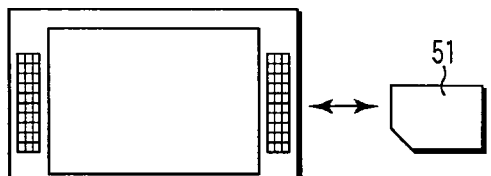
FIG. 11 is a front view diagrammatically showing another electronic device using the electronic card shown in FIG. 9.
Figure 16:
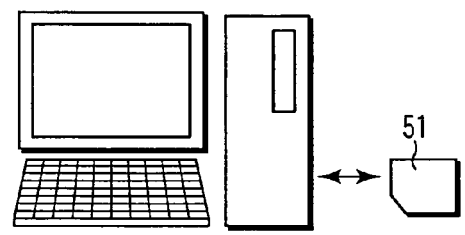
FIG. 16 is a front view diagrammatically showing a further electronic device using the electronic card shown in FIG. 9.
Figure 12:
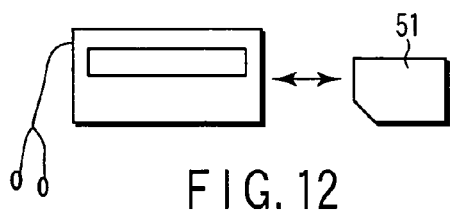
FIG. 12 is a front view diagrammatically showing a further electronic device using the electronic card shown in FIG. 9.
Figure 17:
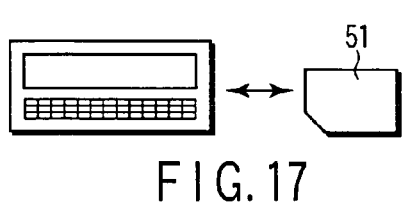
FIG. 17 is a front view diagrammatically showing a further electronic device using the electronic card shown in FIG. 9.
Figure 13:
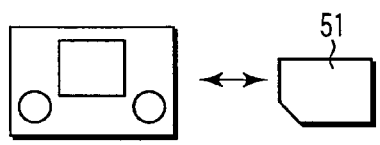
FIG. 13 is a front view diagrammatically showing a further electronic device using the electronic card shown in FIG. 9.
Figure 18:
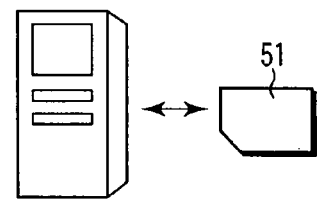
FIG. 18 is a front view diagrammatically showing a further electronic device using the electronic card shown in FIG. 9.
Figure 14:
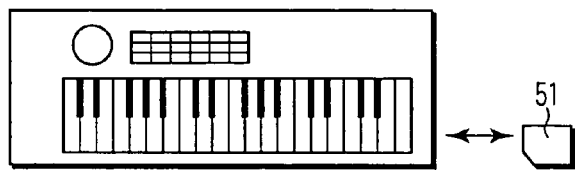
FIG. 14 is a front view diagrammatically showing a further electronic device using the electronic card shown in FIG. 9.
Figure 19:
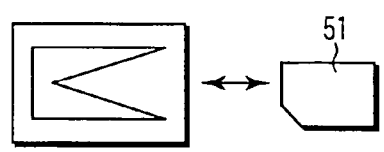
FIG. 19 is a front view diagrammatically showing a further electronic device using the electronic card shown in FIG. 9.
Figure 22:
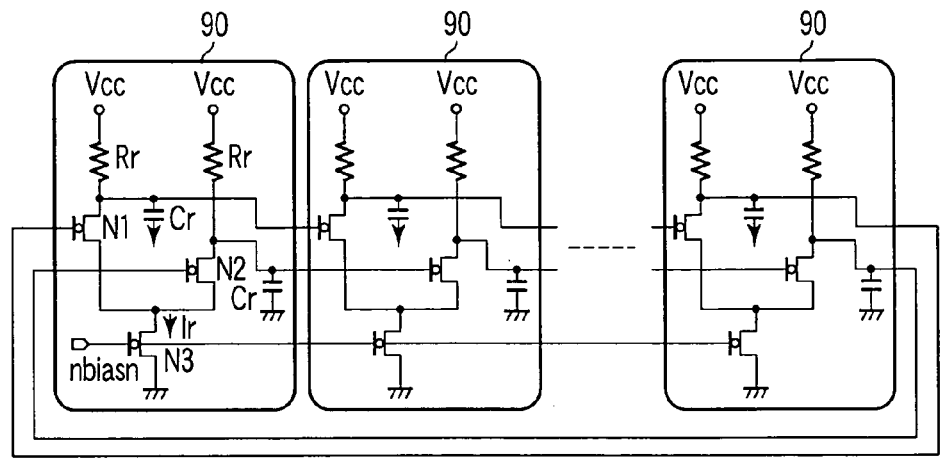
FIG. 22 is a circuit arrangement showing another example of a conventional ring oscillator having a built-in semiconductor device.
Figure 23:
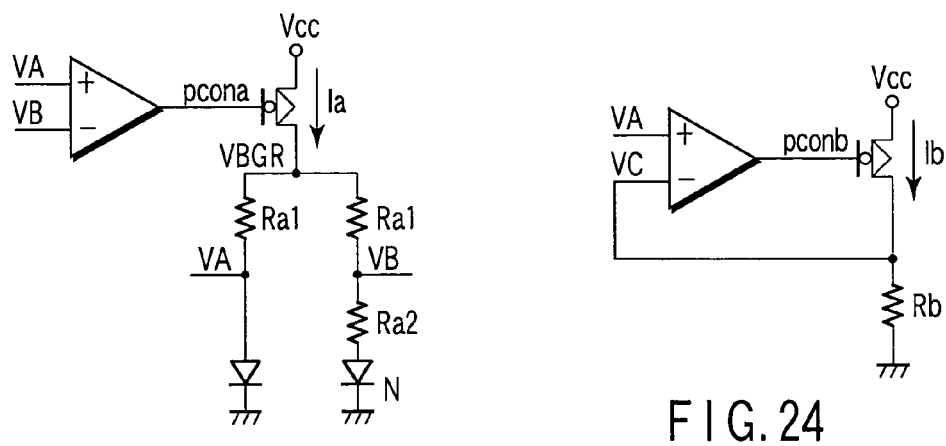
FIG. 23 is a circuit arrangement showing one example of a BGR type current supply having a positive temperature characteristic.
Figure 24:
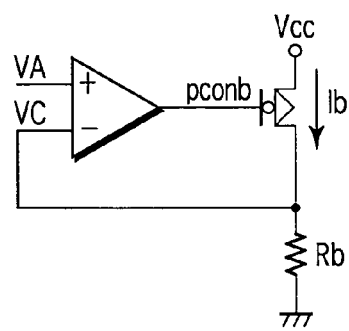
FIG. 24 is a circuit arrangement showing one example of a current supply having a negative temperature characteristic.

The electronic card shown in FIG. 9 can be applied to not only a hand-held electronic device such as a digital still camera as shown in FIG. 9 but also various kinds of devices briefly shown, for example, in FIGS. 10 to 19. That is, FIG. 10 shows a video camera; FIG. 11, a television; FIG. 12, an audio device; FIG. 13, a gaming device; FIG. 14, an electronic musical instrument; FIG. 15, a hand-held telephone; FIG. 16, a personal computer; FIG. 17, a personal digital assistant (PDA); FIG. 18, a voice recorder; and FIG. 19, a PC card, such as a PC and memory, having a configuration under a PCMCIA standard for instance.

Although, in the sixth embodiment, the NAND flash memory has been explained as a nonvolatile semiconductor memory device, the memory device is not restricted to the NAND flash memory. It may be, for example, a NOR flash memory.

According to the embodiments of the present invention, it is possible to provide a current supply circuit having a negative dependence with respect to the power supply voltage.

According to the embodiments of the present invention, a ring oscillator is provided which can improve the efficiency of a booster circuit by the use of an output clock whose period becomes shorter as a power supply voltage is lowered and becomes longer as the power supply voltage is raised.

According to the embodiments of the present invention, a ring oscillator can be provided which can output a clock of an accurate period without depending upon a power supply voltage used and threshold value of the transistor element or can accurately control the clock period.

According to the embodiments of the present invention, it is possible to provide a nonvolatile semiconductor memory device with a mounted ring oscillator as well as an electronic card and electronic device using the memory device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A ring oscillator comprising:
   a current supply which supplies a current having a negative dependence with respect to a power supply voltage; and
   an odd number stage of current controlled type unit delay elements connected in a ring-like array and a delay time of the delay elements is controlled by the current supply.

2. A ring oscillator according to claim 1, wherein
   the unit delay element comprises a differential amplifier, and
   the differential amplifier comprises a current supply MOS transistor having a gate supplied with a bias voltage having a negative power supply voltage dependence, a pair of differential inputting MOS transistors having each one end side connected to the current supply MOS transistor, and load resistors each connected between the other end side of the pair of differential inputting MOS transistors and a power supply.

3. The ring oscillator according to claim 1, wherein
   the unit delay element is comprised of a differential amplifier, and
   the differential amplifier includes a current supply MOS transistor having a gate supplied with a first bias voltage having a negative power supply voltage dependence, a pair of differential inputting MOS transistors each having one end side connected to the current supply MOS transistor, and a negative resistance pair of MOS transistors each connected between the other end side of the differential inputting MOS transistor and a power supply and a gate of each of the negative resistance pair of MOS transistors is supplied with a second bias voltage having a negative power supply voltage dependence.

4. A ring oscillator according to claim 1, wherein the unit delay element comprises a CMOS inverter circuit with a corresponding power supply MOS transistor inserted on a power supply side and on a grounded side and the gate of the current supply MOS transistor is supplied with a bias voltage having a negative power supply voltage dependence.

5. A nonvolatile semiconductor memory device comprising:
   a booster circuit configured to receive a clock signal generated by a ring oscillator, wherein the ring oscillator comprises
   a current supply which supplies a current having a negative dependence with respect to a power supply voltage, and
   an odd number stage of current controlled type unit delay elements connected in a ring-like array and a delay time of the delay elements is controlled by the current supply.

6. A nonvolatile semiconductor memory device according to claim 5, wherein
   the unit delay element of the ring oscillator comprises a differential amplifier, and
   the differential amplifier comprises a current supply MOS transistor having a gate supplied with a bias voltage having a negative power supply voltage dependence, a pair of differential inputting MOS transistors having each one end side connected to the current supply MOS transistor, and load resistors each connected between the other end side of the pair of differential inputting MOS transistors and a power supply.

7. A nonvolatile semiconductor memory device according to claim 5, wherein the unit delay element of the ring oscillator comprises a differential amplifier, and the differential amplifier includes a current supply MOS transistor having a gate supplied with a first bias voltage having a negative power supply voltage dependence, a pair of differential inputting MOS transistors each having one end side connected to the current supply MOS transistor, and a negative resistance pair of MOS transistors each connected between the other end side of the differential inputting MOS transistor and a power supply and a gate of each of the negative resistance pair of MOS transistors is supplied with a second bias voltage having a negative power supply voltage dependence.

8. A nonvolatile semiconductor memory device according to claim 5, wherein the unit delay element of the ring oscillator comprises a CMOS inverter circuit with a corresponding power supply MOS transistor inserted on a power supply side and on a grounded side and the gate of the current supply MOS transistor is supplied with a bias voltage having a negative power supply voltage dependence.

9. A nonvolatile semiconductor memory device according to claim 5, further comprising a nonvolatile memory which includes a cell array for allowing a data read/write/erase operation with the use of an output voltage of the booster circuit.

10. An electronic card having a nonvolatile semiconductor memory device, the nonvolatile semiconductor memory device comprising:

a booster circuit configured to receive a clock signal generated by a ring oscillator, wherein the ring oscillator comprises:

a current supply which supplies a current having a negative dependence with respect to a power supply voltage; and an odd number stage of current controlled type unit delay elements connected in a ring-like array and a delay time of the delay elements is controlled by the current supply.

11. An electronic card having a nonvolatile semiconductor memory device, according to claim 10, wherein the unit delay element of the ring oscillator comprises a differential amplifier, and the differential amplifier comprises a current supply MOS transistor having a gate supplied with a bias voltage having a negative power supply voltage dependence, a pair of differential inputting MOS transistors having each one end side connected to the current supply MOS transistor, and load resistors each connected between the other end side of the pair of differential inputting MOS transistors and a power supply.

12. An electronic card having a nonvolatile semiconductor memory device, according to claim 10, wherein the unit delay element of the ring oscillator comprises a differential amplifier, and, the differential amplifier includes a current supply MOS transistor having a gate supplied with a first bias voltage having a negative power supply voltage dependence, a pair of differential inputting MOS transistors each having one end side connected to the current supply MOS transistor, and a negative resistance pair of MOS transistors each connected between the other end side of the differential inputting MOS transistor and a power supply and a gate of each of the negative resistance pair of MOS transistors is supplied with a second bias voltage having a negative power supply voltage dependence.

13. An electronic card having a nonvolatile semiconductor memory device, according to claim 10, wherein the unit delay element of the ring oscillator comprises a CMOS inverter circuit with a corresponding power supply MOS transistor inserted on a power supply side and on a grounded side and the gate of the current supply MOS transistor is supplied with a bias voltage having a negative power supply voltage dependence.

14. An electronic card having a nonvolatile semiconductor memory device, according to claim 10, the nonvolatile semiconductor memory device further comprising a nonvolatile memory which includes a cell array for allowing a data read/write/erase operation with the use of an output voltage of the booster circuit.

15. An electronic device comprising:

an electronic card having a nonvolatile semiconductor memory device, the nonvolatile semiconductor memory device comprising a booster circuit configured to receive a clock signal generated by a ring oscillator, wherein the ring oscillator comprises a current supply which supplies a current having a negative dependence with respect to a power supply voltage and an odd number stage of current controlled type unit delay elements connected in a ring-like array and a delay time of the delay elements is controlled by the current supply;

a card slot electrically connectable to the electronic card; and a card interface connected to the card slot.

16. An electronic device according to claim 15, wherein the unit delay element of the ring oscillator comprises a differential amplifier, and the differential amplifier comprises a current supply MOS transistor having a gate supplied with a bias voltage having a negative power supply voltage dependence, a pair of differential inputting MOS transistors having each one end side connected to the current supply MOS transistor, and load resistors each connected between the other end side of the pair of differential inputting MOS transistors and a power supply.

17. An electronic device according to claim 15, wherein the unit delay element of the ring oscillator comprises a differential amplifier, and, the differential amplifier includes a current supply MOS transistor having a gate supplied with a first bias voltage having a negative power supply voltage dependence, a pair of differential inputting MOS transistors each having one end side connected to the current supply MOS transistor, and a negative resistance pair of MOS transistors each connected between the other end side of the differential inputting MOS transistor and a power supply and a gate of each of the negative resistance pair of MOS transistors is supplied with a second bias voltage having a negative power supply voltage dependence.

18. An electronic card device according to claim 15, wherein the unit delay element of the ring oscillator comprises a CMOS inverter circuit with a corresponding power supply MOS transistor inserted on a power supply side and on a grounded side and the gate of the current supply MOS transistor is supplied with a bias voltage having a negative power supply voltage dependence.

19. An electronic device according to claim 15, the nonvolatile semiconductor memory device further comprising a nonvolatile memory which includes a cell array for allowing a data read/write/erase operation with the use of an output voltage of the booster circuit.

20. An electronic device according to claim 15, wherein the electronic device is a digital still camera.

21. An electronic device according to claim 15, wherein the electronic device is a personal digital assistant.

22. An electronic device according to claim 15, wherein the electronic device is a voice recorder.

23. An electronic device according to claim 15, wherein the electronic device is a PC card.

* * * * *